(12) United States Patent
Ehrne

(10) Patent No.: US 11,333,227 B2
(45) Date of Patent: May 17, 2022

(54) ASSEMBLY HAVING A FIRST CHAMBER AND AT LEAST ONE SECOND CHAMBER

(71) Applicant: VAT HOLDING AG, Haag (CH)

(72) Inventor: Florian Ehrne, Frumsen (CH)

(73) Assignee: VAT Holding AG, Haag (CH)

( * ) Notice: Subject to any disclaimer, the term of this patent is extended or adjusted under 35 U.S.C. 154(b) by 214 days.

(21) Appl. No.: 16/612,944

(22) PCT Filed: May 9, 2018

(86) PCT No.: PCT/EP2018/062130
§ 371 (c)(1),
(2) Date: Nov. 12, 2019

(87) PCT Pub. No.: WO2018/228754
PCT Pub. Date: Dec. 20, 2018

(65) Prior Publication Data
US 2020/0217400 A1  Jul. 9, 2020

(30) Foreign Application Priority Data

Jun. 14, 2017  (AT) .................................. A 254/2017

(51) Int. Cl.
*F16K 3/06* (2006.01)
*F16K 3/10* (2006.01)
(Continued)

(52) U.S. Cl.
CPC ............ *F16H 19/04* (2013.01); *F16H 57/023* (2013.01); *F16K 3/06* (2013.01); *F16K 3/10* (2013.01); *F16K 31/535* (2013.01); *F16K 31/54* (2013.01); *H01L 21/68707* (2013.01); *F16H 2019/046* (2013.01)

(58) Field of Classification Search
CPC .. F16K 31/535; F16K 31/53–54; F16K 51/02; F16K 3/10; F16K 3/06; F16K 41/10–106; F16H 19/04; F16H 57/023; F16H 2019/046; H01L 21/68707
See application file for complete search history.

(56) References Cited

U.S. PATENT DOCUMENTS 1,969,375 A    8/1934  Laurent
2,657,538 A *  11/1953  Myers ................... F15B 15/125
                                                                92/120
(Continued)

FOREIGN PATENT DOCUMENTS

CN    202040356    11/2011
CN    204459397     7/2015
(Continued)

*Primary Examiner* — Marina A Tietjen
(74) *Attorney, Agent, or Firm* — Volpe Koenig

(57) ABSTRACT

An assembly, including a first chamber (1) and at least one second chamber (2) and at least one pivoting drive (3) for pivoting a pivoting object (4) of the assembly, wherein the pivoting object (4) is arranged in the first chamber (1) and at least one intermediate wall (5) is arranged between the first chamber (1) and the second chamber (2). A transmission body (6), which is annular at least in some sections, can be rotated about an axis of rotation (7) by the pivoting drive (3) and is fed through at least one feed-through opening (8), preferably two feed-through openings (8), in the intermediate wall (5).

16 Claims, 7 Drawing Sheets

(51) Int. Cl.
*F16K 31/53* (2006.01)
*F16K 31/54* (2006.01)
*F16H 19/04* (2006.01)
*F16H 57/023* (2012.01)
*H01L 21/687* (2006.01)

(56) References Cited

U.S. PATENT DOCUMENTS

| | | | | |
|---|---|---|---|---|
| 2,996,049 | A | * | 8/1961 | Huska ............... F15B 15/125 92/120 |
| 3,070,075 | A | * | 12/1962 | Hanselmann ........ F01B 17/02 91/290 |
| 3,246,580 | A | * | 4/1966 | Huska ............... F15B 15/10 92/120 |
| 3,281,065 | A | * | 10/1966 | Chaffiotte ........... F15B 15/125 417/484 |
| 3,446,120 | A | * | 5/1969 | Franz ............... F01C 1/063 92/120 |
| 3,731,597 | A | * | 5/1973 | Payne ............... F15B 15/125 92/120 |
| 4,499,919 | A | | 2/1985 | Forester |
| 4,596,377 | A | | 6/1986 | Taylor |
| 4,683,763 | A | | 8/1987 | Balter |
| 4,885,946 | A | | 12/1989 | Balter |
| 4,885,947 | A | | 12/1989 | Balter et al. |
| 4,901,977 | A | | 2/1990 | Hendrick |
| 5,243,867 | A | | 9/1993 | Polyak |
| 5,618,027 | A | | 4/1997 | Nevrekar |
| 2007/0290157 | A1 | | 12/2007 | Schoen |
| 2009/0057596 | A1 | | 3/2009 | Coleman et al. |
| 2010/0314570 | A1 | | 12/2010 | Ellis et al. |
| 2011/0260087 | A1 | | 10/2011 | Perr et al. |
| 2014/0346724 | A1 | | 11/2014 | Gwehenberger |
| 2016/0033061 | A1 | | 2/2016 | Tatzreiter |
| 2017/0175901 | A1 | | 6/2017 | Wellner et al. |

FOREIGN PATENT DOCUMENTS

| | | | |
|---|---|---|---|
| CN | 105626896 | 6/2016 | |
| CN | 205298663 | 6/2016 | |
| CN | 205300768 | 6/2016 | |
| CN | 106195306 | 12/2016 | |
| CN | 206221700 | 6/2017 | |
| DE | 506089 | 9/1930 | |
| DE | 2354901 A1 | * 5/1975 | ........... F16K 1/2007 |
| DE | 3606944 | 9/1987 | |
| DE | 3938753 | 12/1990 | |
| FR | 528953 | 11/1921 | |
| GB | 345369 | 3/1931 | |
| JP | 200342310 | 2/2003 | |
| WO | 2006048200 | 5/2006 | |
| WO | 2012080569 | 6/2012 | |

* cited by examiner

ASSEMBLY HAVING A FIRST CHAMBER AND AT LEAST ONE SECOND CHAMBER

BACKGROUND

The present invention relates to an assembly having a first chamber and at least one second chamber and at least one pivoting drive for pivoting a pivoted object of the assembly, wherein the pivoted object is arranged in the first chamber and at least one intermediate wall is arranged between the first chamber and the second chamber.

Assemblies of the type in question are employed, for example, when a pivoted object is to be pivoted in a first chamber, but the pivoting drive for pivoting the pivoted object is to be arranged in the second chamber. This separation may be necessary, for example, when the first chamber is a process chamber, in which a process has to be carried out under certain pressure and/or temperature conditions and/or when special gas or fluid compositions have to be set in the first chamber in order to allow the process taking place in the first chamber. One example of assemblies of the type in question are "vacuum valves", in which the drive is often not supposed to be arranged in the first chamber or process chamber in order, for example, to avoid having to deal with particle developments in the drive as a disturbing factor in the first chamber.

An assembly of the type in question is known from U.S. Pat. No. 5,243,867, for example. In this document, a shaft is fed through the intermediate wall in an appropriately sealed form in order to allow a pivoting movement in said wall via an eccentric.

SUMMARY

It is the object of the invention to provide a new method of transmitting the movement of the pivoting drive to the pivoted object in assemblies of the type in question.

For this purpose, the present invention envisages that a transmission body which is annular at least in some section or sections can be rotated about an axis of rotation by the pivoting drive and is fed through at least one feed-through opening, preferably two feed-through openings, in the intermediate wall.

In other words, the invention provides a transmission body which is annular at least in some section or sections, which can be rotated about an axis of rotation by the pivoting drive and is fed through at least one, preferably two, feed-through opening(s) in the intermediate wall that separates the two chambers from one another. To emphasize its separating function, the intermediate wall could also be referred to as a partition wall.

The transmission body, which is annular at least in some section or sections, could also be referred to as a transmission ring, wherein this transmission ring may also be a ring segment, i.e. does not necessarily have to be a completely closed ring.

One significant feature here is that the annular transmission body surrounds an inner opening or inner cavity, as is already evident from the general definition of a ring. It is expedient if a partial region of the intermediate wall is arranged in said inner opening. It is expedient if the ring segment of the transmission body is fed through the feed-through opening or the two feed-through openings. If two feed-through openings are involved, it is expedient if these are arranged spaced apart from one another in the intermediate wall. It is expedient if the respective feed-through opening defines a plane in which the axis of rotation is also situated. If there are two feed-through openings involved, it is expedient if this applies to both feed-through openings, although it does not necessarily have to be the same plane.

The first chamber can be a process chamber in which the desired pressure and/or temperature conditions and/or the desired composition of the gases or fluids present in the process chamber can be set.

It is expedient if the pivoting drive is arranged in the second chamber. In these cases, the second chamber could also be referred to as a drive chamber. Of course, this does not exclude the possibility of the pivoting drive also having a dedicated housing, which can then of course be arranged in the drive chamber. The pivoting drive and the housing thereof, where present, can of course be arranged completely or only partially in the second chamber.

In the case of the transmission body, which is annular at least in some section or sections, it is expedient if the height of the ring, measured parallel to the axis of rotation, is significantly less than the outside diameter of the ring. The height of this ring, measured parallel to the axis of rotation, is preferably no more than half, preferably no more than a third or no more than a quarter, of the outside diameter of the ring.

In preferred forms of an embodiment, provision is made for the transmission body to be arranged both in the first chamber and in the second chamber. This may always be the case. However, it is also possible to envisage that this applies only to certain operating states. However, it is expedient for the transmission body to be supported exclusively in the second chamber. This means that it is expedient for the entire support and the entire drive of the transmission body to be implemented or to take place in the second chamber. Furthermore, provision is preferably made, for rotation about the axis of rotation, for the transmission body to be in engagement in the second chamber with the pivoting drive. In contrast, it is expedient if the pivoted object is secured in the first chamber on the transmission body. In general, it is not possible for the pivoted object to be fed through the feed-through opening in the intermediate wall through which the transmission body, which is annular in some section or sections, is fed.

The pivoted object can be a closure member for closing a valve opening of the assembly, for example. It is expedient if the valve opening is arranged in the first chamber. The closure member can be a valve disk, a valve needle or the like, for example. In such cases, an assembly according to the invention may also be referred to as a valve. As a particular preference, this is a vacuum valve. The latter is a valve which is used in vacuum engineering. The term vacuum engineering is generally used when operating pressures of less than or equal to 0.001 mbar or 0.1 Pascal are achieved. Vacuum valves are valves which are designed for these pressure ranges and/or corresponding pressure differences with respect to the surroundings. However, it is also possible more generally to use the term vacuum valves when they are designed for pressures below normal pressure, i.e. below 1 bar. Generally speaking, assemblies according to the invention can be designed as valves suitable for differential pressures or in other words as differential pressure valves. These are, in particular, valves, the closure members of which are suitable for sealing off the valve opening even against differential pressures of at least 1 bar. Here, the differential pressure is the pressure difference on the mutually opposite sides of the closure member in the closed position. In particular, the differential pressure results from the respective pressures exerted on the closure member by the fluid which is present.

The pivoted object does not necessarily have to be a closure member. In principle, the pivoted object can be implemented in all possible forms of embodiment and can be used for an extremely wide variety of tasks. It is possible, for example, for the pivoted object to be a handling device for processing and/or handling and/or moving an object in the first chamber. All handling devices known per se may be considered for the handling device. In particular, they may be robot arms. These can be of telescopic, pivotable or rotatable design or can be of any other design, for example. They can carry grippers, vacuum grippers or other actuators.

Preferred variants of the invention envisage that the transmission body, which is annular in some section or sections, is sealed off with respect to the intermediate wall, at least in the region of the feed-through opening(s). Thus, for example, provision can be made for the transmission body to be sealed off with respect to the intermediate wall by at least one sealing ring. Other forms of embodiment can provide for the transmission body to be surrounded at least in some region or regions, preferably in the first chamber, by at least one bellows, and to be sealed off with respect to the intermediate wall by the bellows. It is expedient if the bellows is then likewise in the form of a ring segment. Thus, provision can be made for the bellows to be extended or compressed in the shape of a ring segment, depending on the direction of rotation, by a rotary movement of the transmission body about the axis of rotation. The bellows may be a diaphragm bellows, for example. Thus, the bellows may be produced from metal or metal alloys, e.g. from stainless steel or a nickel-based alloy. However, it may also be an elastomer bellows, e.g. made from polytetrafluoroethylene (Teflon or PTFE).

It is expedient if the transmission body, which is annular at least in some section or sections, has a rounded, preferably circular or at least oval, cross section, at least in the region in which the seal or the bellows rest against it.

Preferred forms of embodiment envisage that, in addition to the rotary movement about the axis of rotation, the transmission body can be moved in at least one additional direction of movement. For this purpose, it is expedient if an additional drive is provided. The additional direction of movement can be parallel to the axis of rotation, for example.

In principle, both the pivoting drive and the additional drive could also be manually operated drives. However, the pivoting drive and/or the additional drive are/is preferably motor drives, wherein all variants suitable for the respective use that are known in the prior art are conceivable here. They can therefore be motors for producing a rotary movement but also linear motors. Electric, pneumatic, hydraulic or other motors can be used, for example. There are therefore numerous different possibilities for the embodiment of said drives.

For the sake of completeness, attention is drawn to the fact that the transmission body which is annular at least in some section or sections is always being referred to here, even if only the term transmission body is used.

BRIEF DESCRIPTION OF THE DRAWINGS

Examples of how the invention can be embodied are explained in the following description of the figures with reference to various variant embodiments, in which.

DETAILED DESCRIPTION

Figure 1:
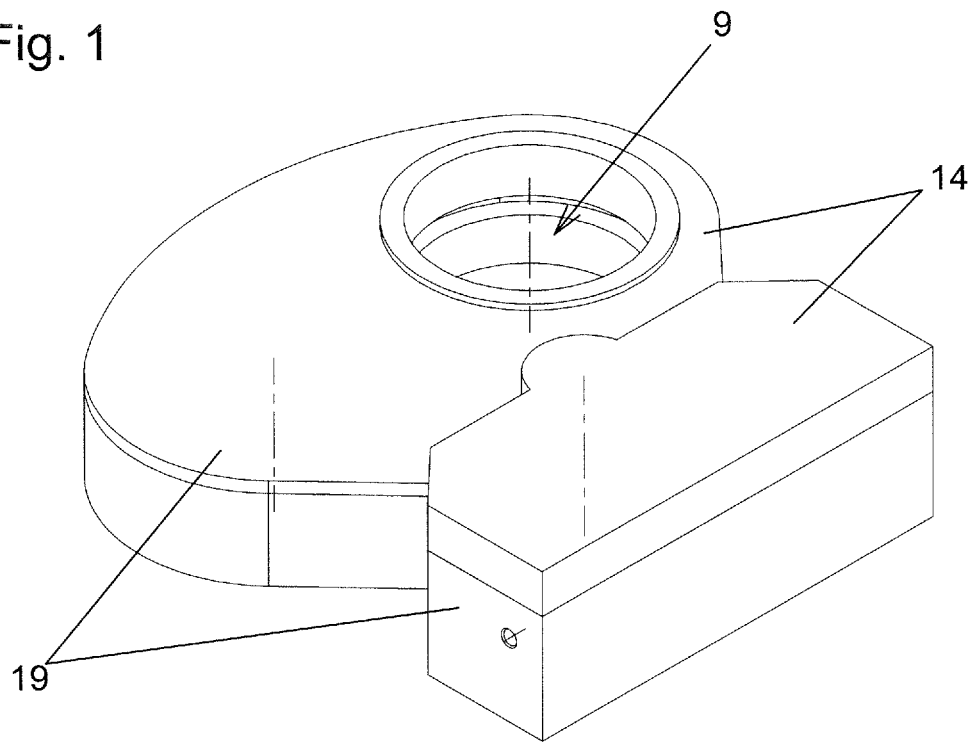
FIGS. 1 to 10 show various illustrations of a first embodiment example according to the invention.
Figure 2:
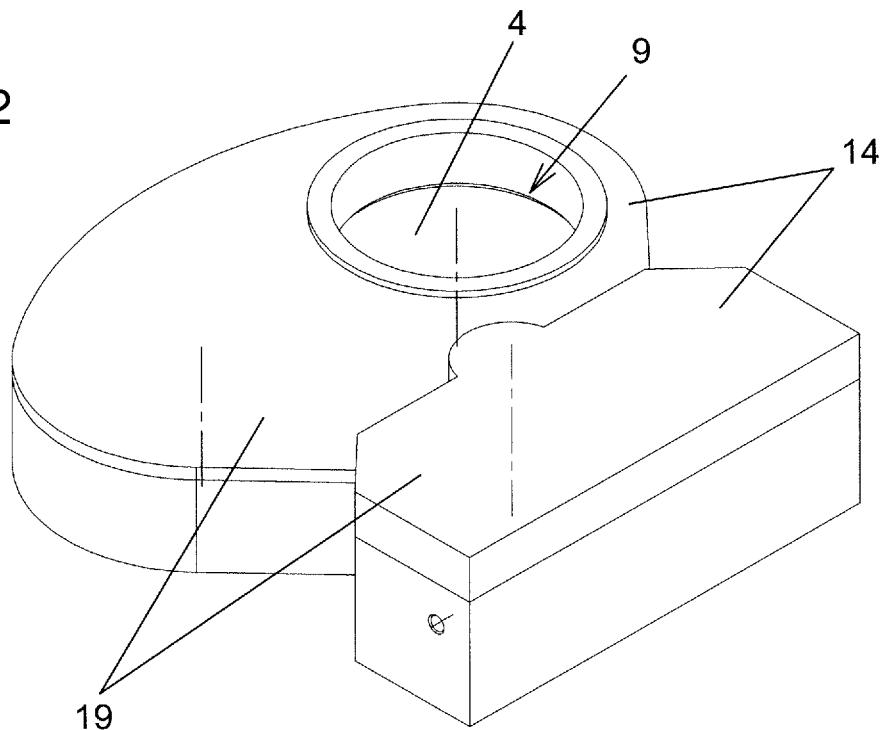

In the case of the first embodiment example, the assembly according to the invention is embodied in the form of a valve, in particular a vacuum valve. In FIGS. 1 and 2, external views of the housing 14 of the assembly according to the invention can be seen. Also illustrated here is the valve opening 9, which can be opened or closed by the pivoted object 4, here designed as a closure member. The housing 14 has the housing walls 19, which surround the first and second chambers 1 and 2, together with the intermediate wall 5, as described below.

FIG. 1 shows the position in which the valve opening 9 of the pivoted object 4, here designed as a valve-disk-type closure member is open. In FIG. 2, the pivoted object 4 designed as a valve disk closes the valve opening 9.

Figure 3:
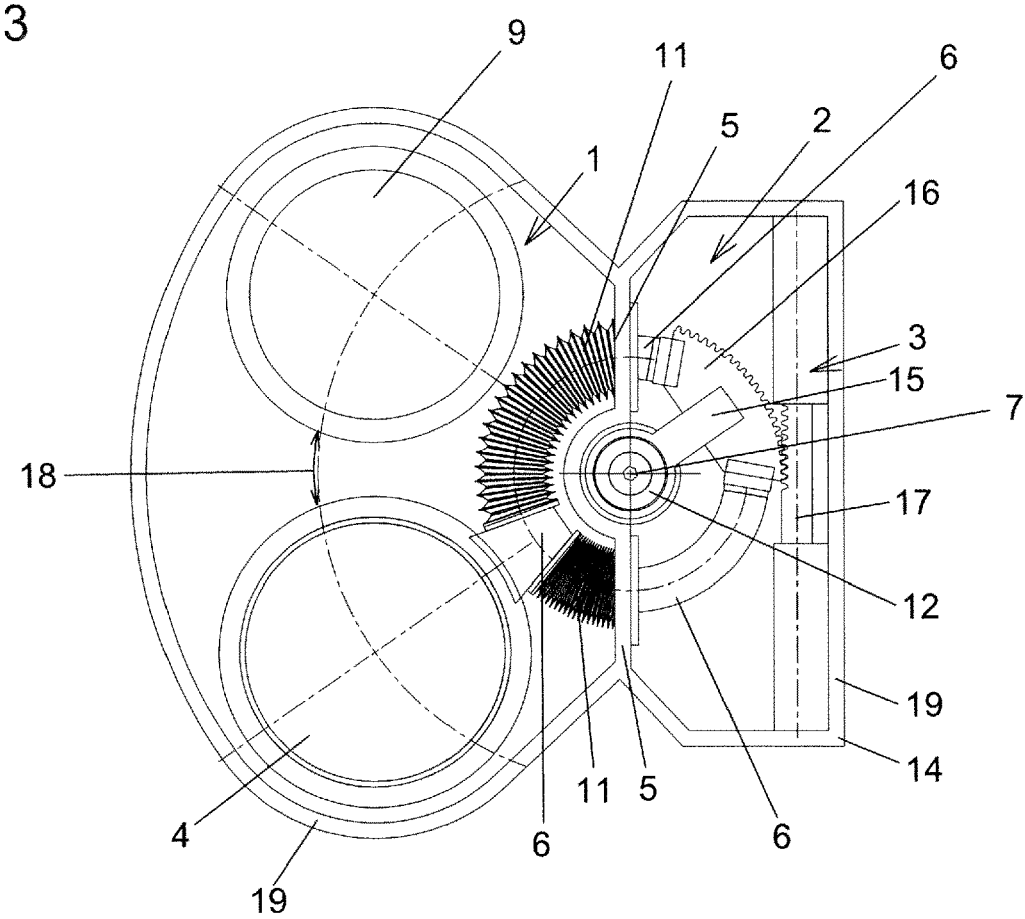
Figure 4:
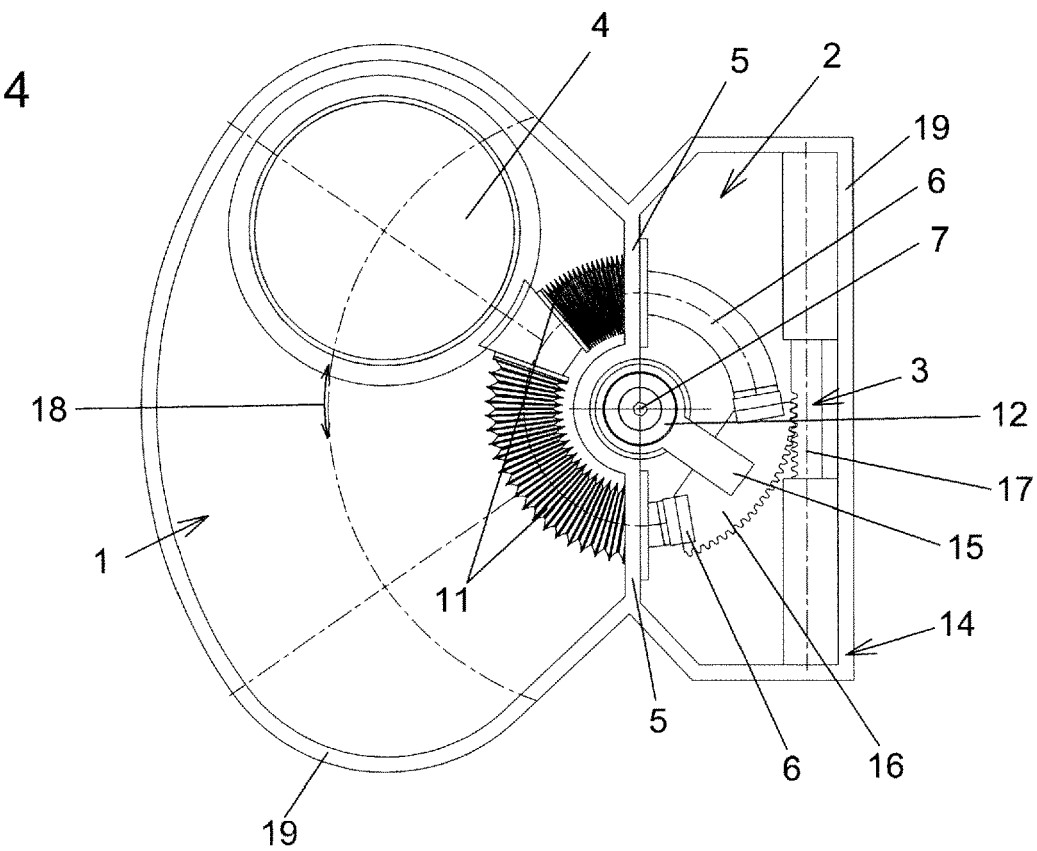

FIGS. 3 and 4 then show the views into the opened housing 14 of the assembly according to the invention in the first embodiment example. Clearly visible here are first of all the first chamber 1 and the second chamber 2, which are separated from one another by the intermediate wall 5. Situated in the first chamber 1 is the pivoted object 4, here embodied as a valve disk, by means of which the valve opening 9 in the housing 14 can be opened, as shown in FIG. 3, and closed, as shown in FIG. 4. The pivoted object 4 is arranged or secured in the first chamber 1, on the transmission body 6 according to the invention, which is of annular design in some region or regions. In this embodiment example, the pivoting drive 3 for rotating the transmission body 6 about the axis of rotation 7 is situated in the second chamber 2. In this embodiment example, the transmission body 6, which is annular in some section or sections, is fed through two mutually spaced feed-through openings 8 in the intermediate wall 5, as can be seen particularly clearly in the sectional illustration shown in FIG. 5. The transmission body 6 in this embodiment example is in each case sealed off with respect to the intermediate wall 5 in the region of the feed-through openings 8. In the first embodiment example, this is accomplished by means of the bellows 11. These are arranged in the first chamber 1 and in each case surround one segment of the transmission body 6. The bellows 11 can be extended or compressed in the shape of a ring segment, depending on the direction of rotation, by means of a rotary movement of the transmission body 6 about the axis of rotation 7. By virtue of the assembly shown, the rotary movement about the axis of rotation 7 produced by the pivoting drive 3 in the second chamber 2 is transmitted by the transmission body 6, which is annular at least in some section or sections, into the first chamber 1, with the result that the pivoted object 4 secured there on the transmission body 6 can be pivoted backward and forward in the pivoting directions 18 between the open position shown in FIG. 3 and the position shown in FIG. 4.

Figure 5:
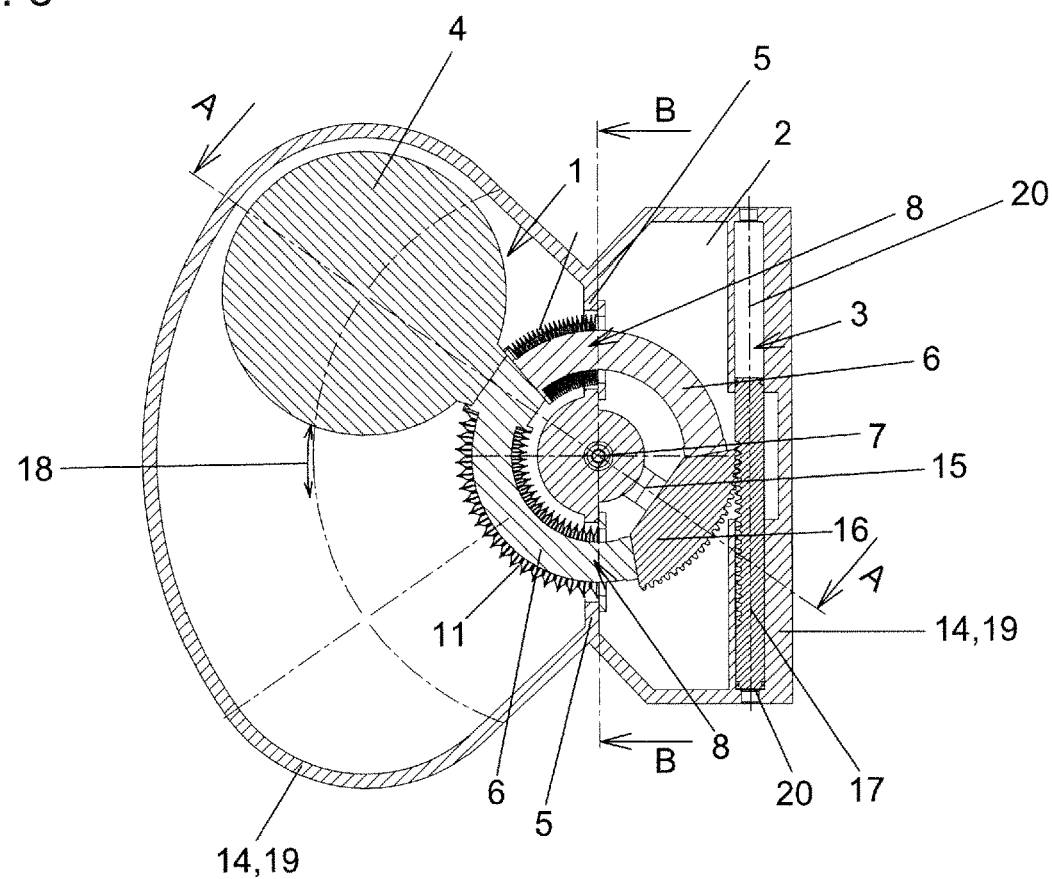

As is particularly clearly evident in the sectional illustration shown in FIG. 5, the first pivoting drive 3 has a rack 17, which is mounted in such a way in the cylinder spaces 20 that it can be moved pneumatically and/or hydraulically. By appropriate pressurization of the respective cylinder spaces 20, the rack 17 can be moved backward and forward in its longitudinal direction, although this is not illustrated in detail. The movement of the rack 17 in its longitudinal directions is transmitted via the tooth engagement into the toothed segment 16 of the transmission body 6 and to the latter, with the result that the transmission body 6 is rotated about the axis of rotation 7 according to the direction of movement of the rack 17. This rotary movement of the transmission body 6 then results in a corresponding pivoting movement of the pivoted object 4 in one of the pivoting directions 18.

In order to be able to move the pivoted object 4 not only in the pivoting directions 18 but also in an additional direction of movement, in this case parallel to the axis of rotation 7, an additional drive 12 is also provided in this first embodiment example. In the first embodiment example, this is a piston-cylinder assembly comprising the pistons 23, which are each mounted movably in a cylinder 24 fixed with respect to the housing. The movement of the pistons 23 in the cylinders 24 can be accomplished hydraulically or pneumatically in a form known per se without the need to depict or explain this in detail here. The transmission body 6, which is annular at least in some section or sections, is connected to the pistons 23 by the yoke 15. Thus, a movement of the pistons 23 along the axis of rotation 7 also leads to a movement of the transmission body 6 parallel to the axis of rotation 7 and hence also to a corresponding movement of the pivoted object 4, here embodied as a valve disk, in a direction parallel to the axis of rotation 7.

Figure 6:
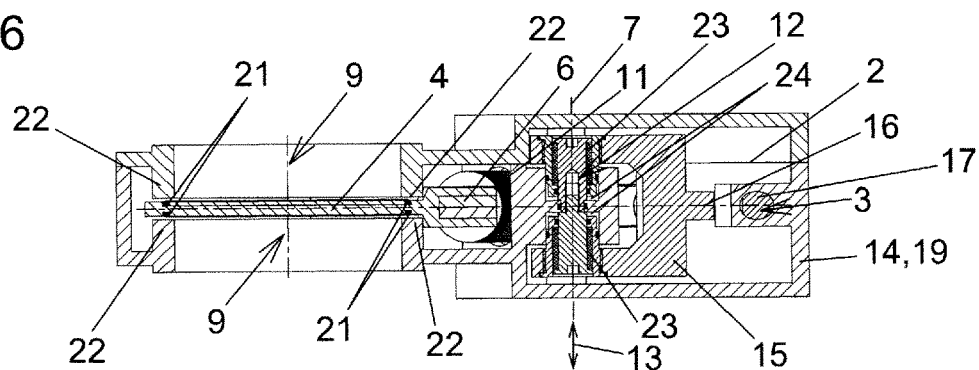
Figure 7:
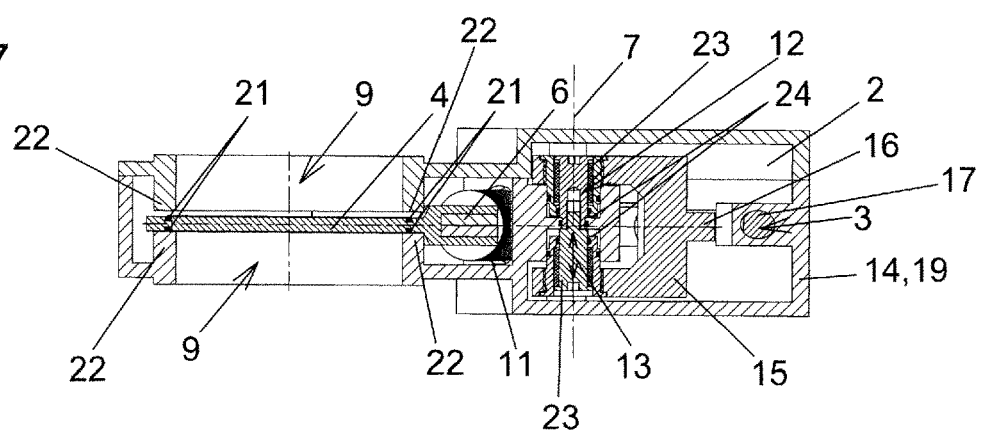
Figure 8:
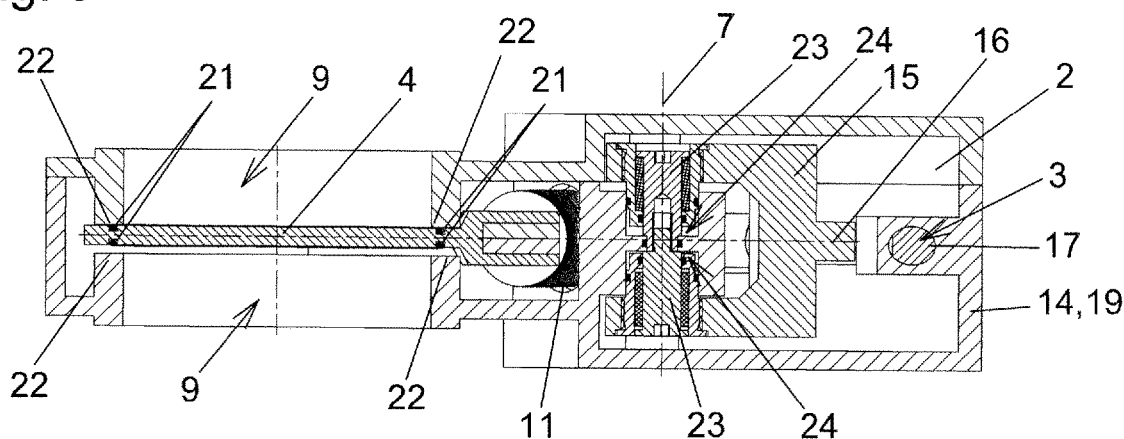

FIGS. 6, 7 and 8 each show sections along section line AA in FIG. 5. Here, FIG. 6 shows the situation in which the pivoted object 4 designed as a valve disk has already been brought into overlap with the valve openings 9 but has not yet been pressed against the valve seats 22 of the housing 14. By appropriate pressurization of the cylinders 24, the pivoted object 4 can then be pressed against the lower valve seat 22, for example, by its seals 21, parallel to the axis of rotation 7, in order to provide a seal and to reach the final closed position, as illustrated in FIG. 7. FIG. 8 shows the situation in which the pivoted object 4 is pressed sealingly against the upper valve seat 22 with the seal 21 of the object positioned in between. Here, the corresponding movement parallel to the axis of rotation 7 is always implemented by the additional drive 12.

Figure 9:
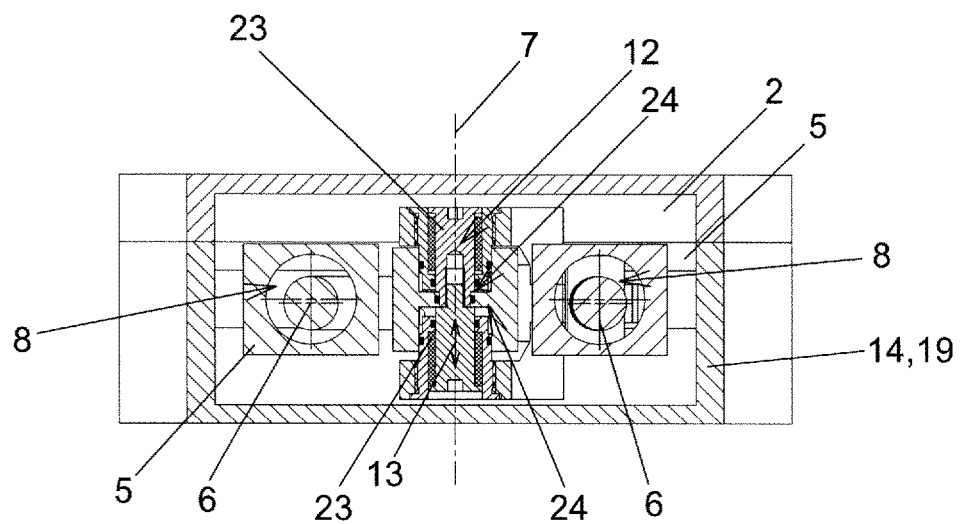
Figure 10:
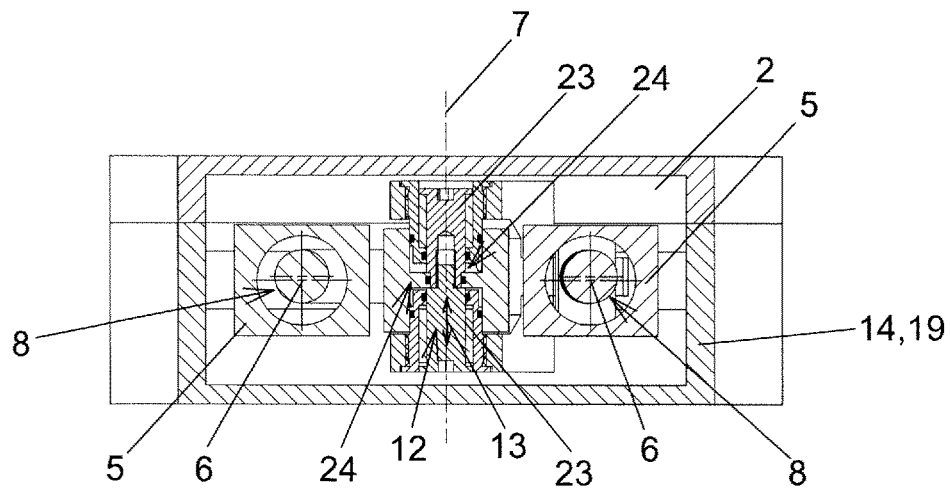

FIGS. 9 and 10 each show a section along section line BB from FIG. 5. From a comparison of FIGS. 9 and 10, it is clearly evident that the transmission body 6 which is annular at least in some section or sections is moved backward and forward within the feed-through opening 8 during its movement along the axis of rotation 7. Here, FIG. 9 corresponds to the position of the pivoted object 4 illustrated in FIG. 7. FIG. 10 corresponds to the position of the pivoted object 4 illustrated in FIG. 8. The use of the bellows 11 makes such a movement of the transmission body 6 parallel to the axis of rotation 7 possible without compromising the sealing between the first chamber 1 and the second chamber 2 by the respective bellows 11.

Figure 11:
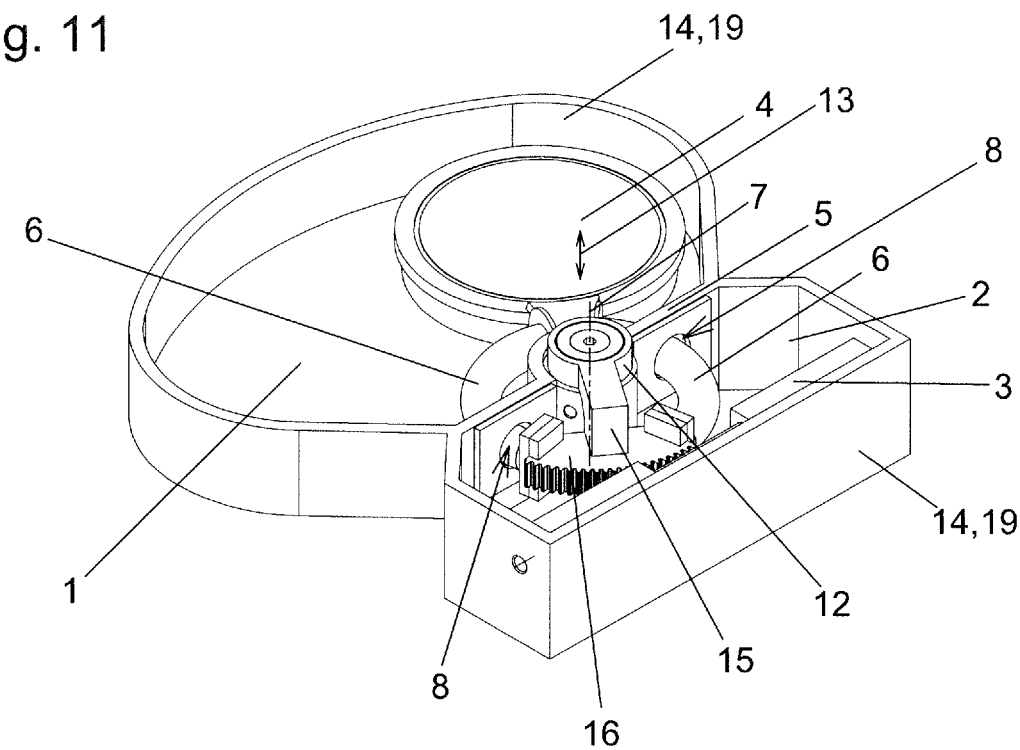
FIGS. 11 and 12 shows a second embodiment example according to the invention.
Figure 12:
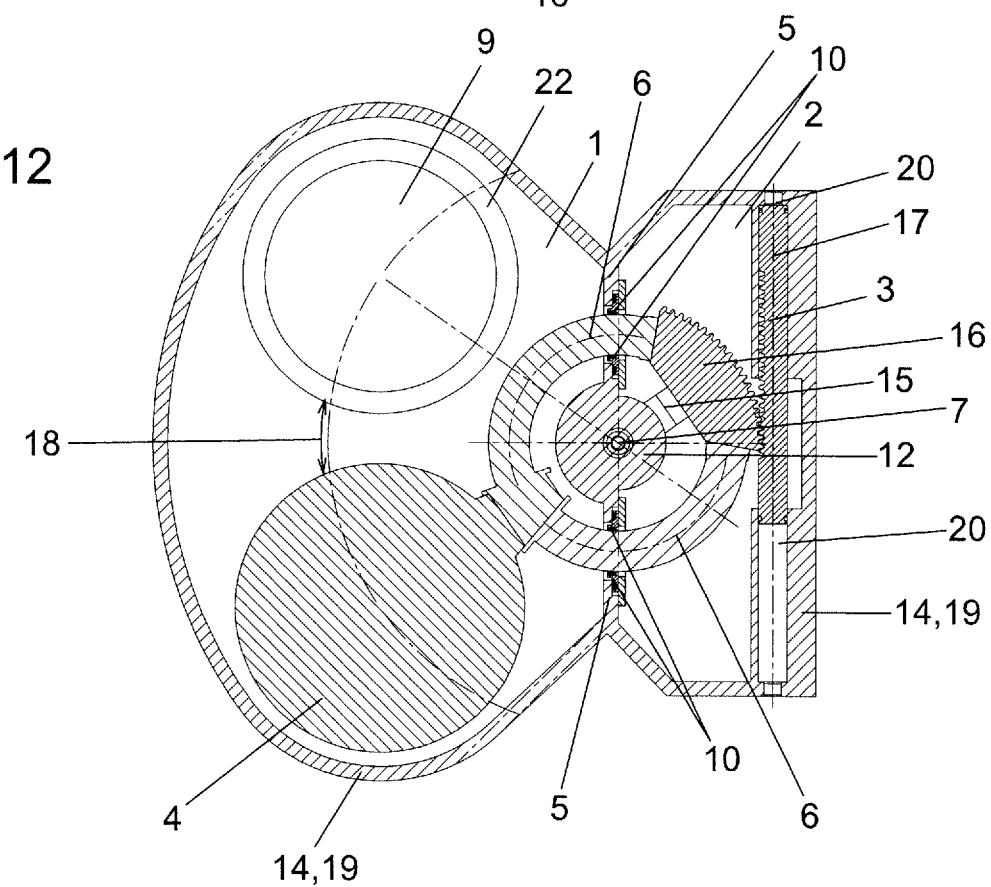

A second embodiment example of an assembly according to the invention is shown in FIGS. 11 and 12. This is a modified form of the first embodiment example shown in FIGS. 1 to 10, and therefore only the significant differences are explored. As regards other aspects, attention is drawn to the above explanations relating to the first embodiment example, which can be applied appropriately.

In FIGS. 11 and 12, the significant difference with respect to the first embodiment example is that, in this second embodiment example, it is not a bellows 11 but in each case at least one sealing ring 10 which is used to seal off the transmission body 6 with respect to the intermediate wall 5. This sealing ring 10 is situated between the intermediate wall 5 and the transmission body 6, in the region of the respective feed-through openings 8, with the result that the transmission body 6 is sealed off with respect to the intermediate wall 5. By means of an appropriate elasticity and appropriate thickness of the respective sealing ring 10, the movements of the transmission body 6 in the additional directions of movement 13 parallel to the axis of rotation 7 are also possible without loss of the sealing effect of the sealing rings 10.

Figure 13:
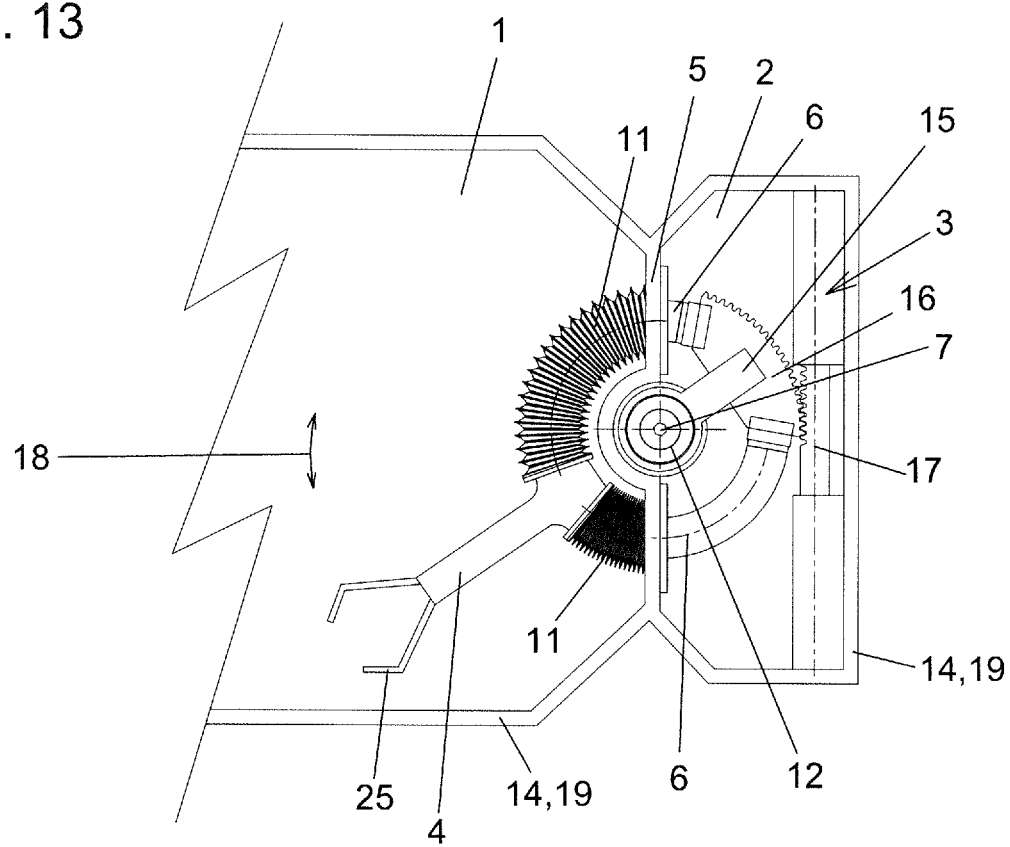
FIG. 13 shows a third embodiment example according to the invention.

Another variant embodiment of the invention is illustrated by way of example in FIG. 13, this once again being a modification of the first embodiment example. Here too, therefore, only the differences with respect to the first embodiment example are explored. The significant difference between this third embodiment example and the first embodiment example consists in that here the pivoted object 4 does not have a closure member but has a handling device, illustrated only in an illustrative and schematic way here, for moving an object to be moved in the first chamber 1. This is illustrated symbolically in FIG. 13 by the gripper 25 of the pivoted object 4. This pivoted object 4, which is illustrated only in a greatly schematized way here and which is secured on the transmission body 6 can thus be a robot arm or some other handling device. It can be of telescopic, pivoting, bending etc. design. All of this is known per se in the prior art and does not have to be described or illustrated in detail.

Figure 14:
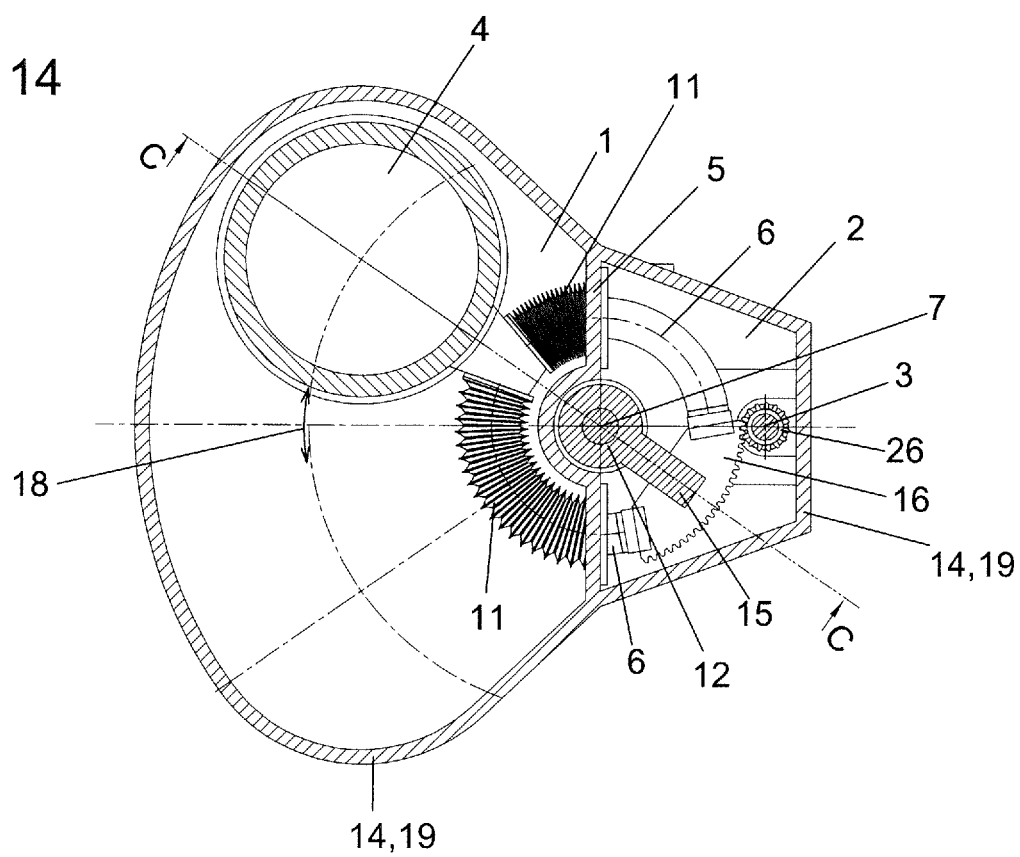
FIGS. 14 and 15 show a fourth embodiment example according to the invention.
Figure 15:
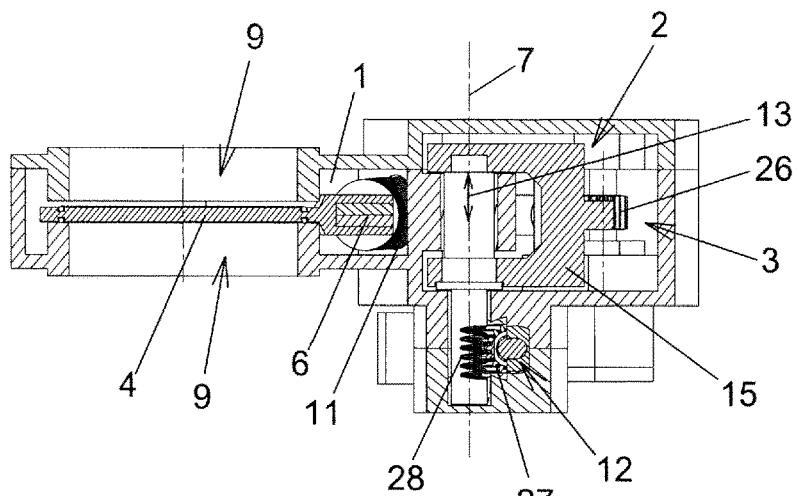

FIGS. 14 and 15 once again show a variant based on the first embodiment example, in which, by way of example, drives other than the pivoting drive 3 and the additional drive 12 are employed. In this fourth embodiment example, the pivoting drive 3 has a gearwheel 26 which is driven by an electric motor, hydraulic motor or the like and which interacts with the toothed segment 16 of the transmission body 6 in such a way that the pivoted object 4, which is once again designed as a valve disk here, can be pivoted in the pivoting directions 18. The additional drive 12 for moving the transmission body 6 in the additional directions of movement 13 parallel to the axis of rotation 7 has a rack 28, in which a gearwheel 27 driven by a motor engages. The rack 28 is connected to the yoke 15 and thus to the transmission body 6, with the result that a movement of the rack 28 in the additional directions of movement 13 leads to a corresponding movement of the transmission body 6 and hence also of the pivoted object 4 parallel to the axis of rotation 7. FIG. 15 shows the section along section line CC from FIG. 14.

Figure 16:
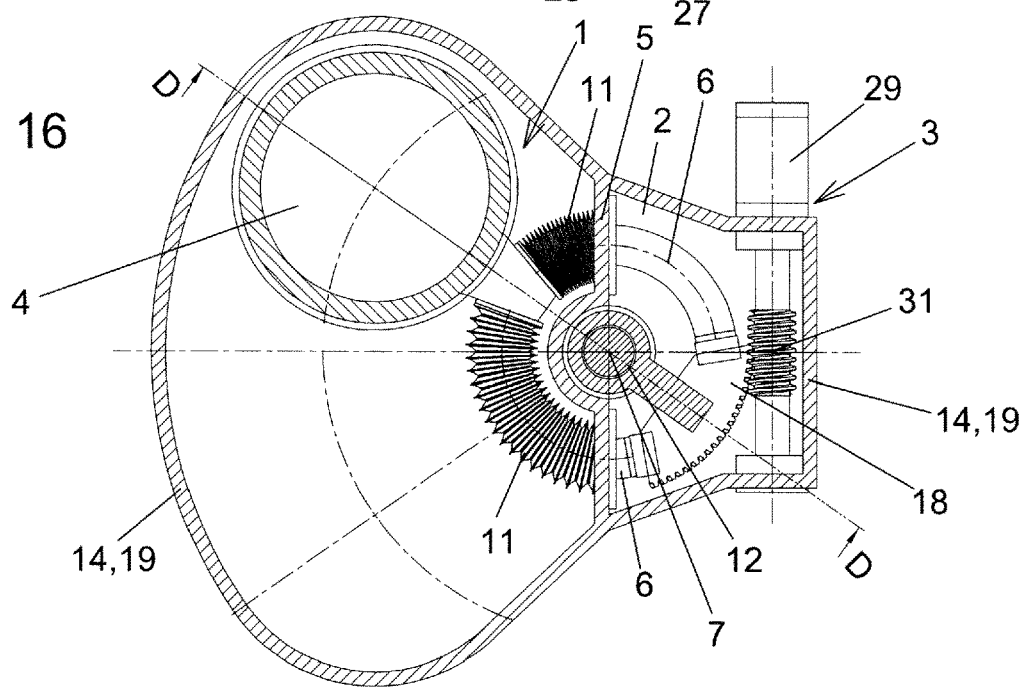
FIGS. 16 and 17 show a fifth embodiment example according to the invention.
Figure 17:
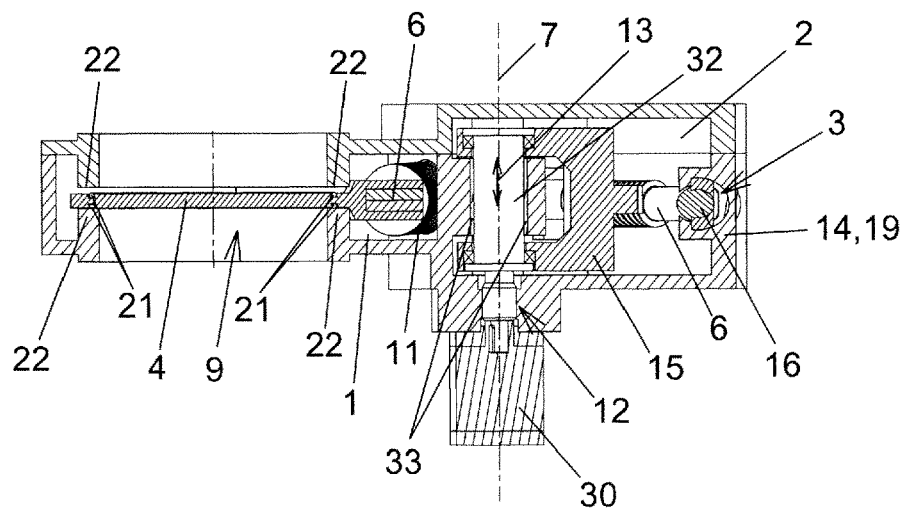

A fifth embodiment example of the invention is illustrated in FIGS. 16 and 17. Here, FIG. 17 shows the section along section line DD from FIG. 16. In this fifth embodiment example, which is once again a modified form of the first embodiment example, the pivoting drive 3 has a worm gear mechanism for pivoting the pivoted object 4 in the pivoting directions 18. This worm gear mechanism is formed, on the one hand, by the worm 31 driven by the motor 29 and, on the other hand, by a correspondingly designed toothed segment 16 of the transmission body 6. Such worm gear mechanisms are known per se and do not have to be explained further. To implement the movement in the additional directions of movement 13 parallel to the axis of rotation 7, the additional drive 12 implemented here has a motor 30, which turns a spindle 32. The spindle 32 engages by its external thread (not illustrated in detail) in an internal thread 33 fixed in a corresponding manner on the housing 14. This has the effect that turning the spindle 33 moves the latter, together with the yoke 15 secured thereon and hence with the transmission body 6 and also with the pivoted object 4, in the additional directions of movement 13 parallel to the axis of rotation 7.

The variants illustrated here illustrate that the type of drive can be of very different designs, both in the case of the pivoting drive 3 and in the case of the additional drive 12.

LEGEND FOR THE REFERENCE NUMERALS

1 first chamber
2 second chamber
3 pivoting drive
4 pivoted object
5 intermediate wall
6 transmission body
7 axis of rotation
8 feed-through opening
9 valve opening
10 sealing ring
11 bellows
12 additional drive
13 additional direction of movement
14 housing
15 yoke
16 toothed segment
17 rack
18 pivoting direction
19 housing wall
20 cylinder space
21 seal
22 valve seat
23 piston
24 cylinder
25 gripper
26 gearwheel
27 gearwheel
28 threaded rod
29 motor
30 motor
31 worm
32 spindle
33 internal thread

The invention claimed is:

1. An assembly comprising:
   a first chamber;
   at least one second chamber;
   a pivoted object;
   at least one pivoting drive that is configured to pivot the pivoted object, wherein the pivoted object is arranged in the first chamber;
   an intermediate wall arranged between the first chamber and the second chamber;
   a transmission body, which is annular at least in some section or sections, is rotatable about an axis of rotation by the pivoting drive and is fed through at least one feed-through opening in the intermediate wall;
   wherein in addition to the rotary movement about the axis of rotation, the transmission body is movable in at least one additional direction of movement.

2. The assembly as claimed in claim 1, wherein the transmission body is arranged both in the first chamber and in the second chamber.

3. The assembly as claimed in claim 1, wherein for rotation about the axis of rotation, the transmission body is in engagement in the second chamber with the pivoting drive.

4. The assembly as claimed in claim 1, wherein the pivoted object comprises a closure member for closing a valve opening of the assembly.

5. The assembly as claimed in claim 4, wherein the closure member comprises a valve disk.

6. The assembly as claimed in claim 1, wherein the pivoted object comprises a handling device for at least one of processing, handling, or moving an object in the first chamber.

7. The assembly as claimed in claim 1, wherein the transmission body is sealed off with respect to the intermediate wall, at least in a region of the at least one feed-through opening.

8. The assembly as claimed in claim 7, wherein the transmission body is sealed off with respect to the intermediate wall by at least one sealing ring.

9. The assembly as claimed in claim 7, wherein the transmission body is surrounded at least in some region or regions by at least one bellows, and is sealed off with respect to the intermediate wall by the bellows.

10. The assembly as claimed in claim 9, wherein the bellows is at least one of extendible or compressible in a shape of a ring segment, depending on a direction of rotation, by a rotary movement of the transmission body about the axis of rotation.

11. The assembly as claimed in claim 9, wherein the transmission body is surrounded at least in said some region or regions in the first chamber by the at least one bellows.

12. The assembly as claimed in claim 1, wherein the at least one additional direction of movement is parallel to the axis of rotation.

13. The assembly as claimed in claim 12, further comprising at least one additional drive for the at least one additional direction of movement.

14. The assembly as claimed in claim 1, wherein the pivoting drive is at least partially arranged in the second chamber.

15. The assembly as claimed in claim 1, wherein the transmission body is supported exclusively in the second chamber.

16. The assembly as claimed in claim 1, wherein the pivoted object is secured in the first chamber on the transmission body.

\* \* \* \* \*